(12) United States Patent
Chen

(10) Patent No.: US 9,229,035 B2
(45) Date of Patent: Jan. 5, 2016

(54) CURRENT DETECTION CIRCUIT AND SWITCH REGULATOR USING THE SAME

(71) Applicant: Silergy Semiconductor Technology (Hangzhou) LTD, Hangzhou, ZheJiang Province (CN)

(72) Inventor: Wei Chen, Saratoga, CA (US)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 128 days.

(21) Appl. No.: 14/202,085

(22) Filed: Mar. 10, 2014

(65) Prior Publication Data

US 2014/0300333 A1      Oct. 9, 2014

(30) Foreign Application Priority Data

Apr. 3, 2013  (CN) .......................... 2013 1 0115871

(51) Int. Cl.
| | |
|---|---|
| *H02M 3/156* | (2006.01) |
| *G01R 19/25* | (2006.01) |
| *G01R 19/00* | (2006.01) |
| *H02M 1/00* | (2007.01) |

(52) U.S. Cl.
CPC ............ *G01R 19/25* (2013.01); *G01R 19/0092* (2013.01); *H02M 3/156* (2013.01); *H02M 2001/0009* (2013.01)

(58) Field of Classification Search
CPC .... H02M 3/156; H02M 3/1588; G01R 19/00; G01R 19/25; Y02B 70/1466
USPC .............................. 323/282, 284–286; 324/72
See application file for complete search history.

(56) References Cited

U.S. PATENT DOCUMENTS

| | | | |
|---|---|---|---|
| 8,253,400 | B2 | 8/2012 | Irissou et al. |
| 8,368,363 | B2 | 2/2013 | Nishida |
| 8,400,133 | B2 | 3/2013 | Kung et al. |
| 8,937,467 | B2* | 1/2015 | Qin ........................ H02M 3/158 323/282 |
| 2007/0210772 | A1* | 9/2007 | Sawtell .................. H02M 3/156 323/282 |
| 2013/0002159 | A1 | 1/2013 | Chen et al. |
| 2013/0175936 | A1 | 7/2013 | Chen |
| 2013/0181626 | A1 | 7/2013 | Chen |
| 2014/0253062 | A1* | 9/2014 | Qin ........................... G05F 1/10 323/271 |

FOREIGN PATENT DOCUMENTS

CN         101651416 A      2/2010

* cited by examiner

*Primary Examiner* — Adolf Berhane
*Assistant Examiner* — Yemane Mehari
(74) *Attorney, Agent, or Firm* — Michael C. Stephens, Jr.

(57) ABSTRACT

In one embodiment, a current detection circuit configured to determine an input current and an output current of a switching regulator, can include: (i) a mirror circuit configured to mirror a current flowing through a main power transistor of the switching regulator to generate a sampling signal that is in proportion to the main power transistor current; (ii) a current generating circuit configured to perform a first average value calculation of the sampling signal based on a switching cycle of the switching regulator to determine the input current; and (iii) the current generating circuit being configured to perform a second average value calculation of the sampling signal based on a conduction duty cycle of the main power transistor to determine the output current.

12 Claims, 10 Drawing Sheets

CURRENT DETECTION CIRCUIT AND SWITCH REGULATOR USING THE SAME

RELATED APPLICATIONS

This application claims the benefit of Chinese Patent Application No. 201310115871.3, filed on Apr. 3, 2013, which is incorporated herein by reference in its entirety.

FIELD OF THE INVENTION

The present invention relates to the field of switch power supply, more particularly, to a current detection circuit applied in a switching regulator and a switching regulator using the same.

BACKGROUND

A switched-mode power supply (SMPS), or a "switching" power supply or voltage regulator, can include a power stage circuit and a control circuit. The power stage circuit can include one or more power devices. When an input voltage is applied, the control circuit can consider internal parameters and external load changes, and may regulate the on/off times of the switch system in the power stage circuit. In this way, the output voltage and/or the output current of the switching power supply can be maintained as substantially constant. Elements in the power stage circuit and/or control circuit can be fabricated in a semiconductor wafer.

SUMMARY

In one embodiment, a current detection circuit configured to determine an input current and an output current of a switching regulator, can include: (i) a mirror circuit configured to mirror a current flowing through a main power transistor of the switching regulator to generate a sampling signal that is in proportion to the main power transistor current; (ii) a current generating circuit configured to perform a first average value calculation of the sampling signal based on a switching cycle of the switching regulator to determine the input current; and (iii) the current generating circuit being configured to perform a second average value calculation of the sampling signal based on a conduction duty cycle of the main power transistor to determine the output current.

DETAILED DESCRIPTION

Figure 1:
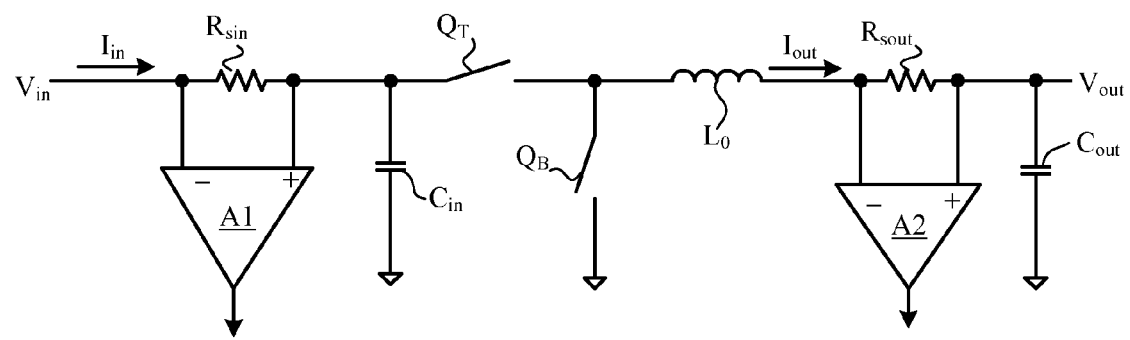
FIG. 1 is a schematic block diagram of an example current detection circuit in a switching regulator.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Switching or switch regulators can be used to provide a stable voltage source or current source to supply various electrical systems or circuitry. A switching regulator can convert an input DC current into a high-frequency voltage, and then filter this high-frequency voltage for conversion into a DC output voltage or output current. Specifically, the switching regulator can include a switch device (e.g., a transistor), an output filter, and a controller (e.g., a pulse-width modulation [PWM] controller). The switch device or transistor can be alternatively connected to and disconnected from an input DC voltage source (e.g., a battery) to supply power to the load (e.g., an integrated circuit). Also, the output filter can be coupled between the input voltage source and the load, can include an inductor and a capacitor, and may be utilized for filtering the output of the switch device to provide the DC output voltage. The controller (e.g., PWM, frequency pulse regulator, etc.) can control a switch state of the switch device according to the state or level of the regulator output signal, so as to output a relatively stable DC voltage or DC current.

In such a switching regulator structure, in order to avoid input side current being too high due to an output short-circuit or circuit over-current situation, which can increase temperature and possibly overheat or damage the switch device or other circuitry, a peak current restricting circuit can be included. When the instantaneous current is too high, the peak current restricting circuit portion can operate to turn off or otherwise restrict the peak current in the switching regulator. In this way, the power switch device or transistor of the switching regulator can be protected.

However, such a restricting circuit may only protect the switching regulator itself, and in some applications, the input power supply (e.g., a universal serial bus [USB] power supply) may also need current limiting protection (e.g., peak current protection), as well as limitations on the average value of the input current. A current limiting protection circuit may utilize current sampling, such as a series connection of a relatively small resistor and/or a Hall element, to obtain a current signal. For example, when the sampling current is relatively low, both sampling approaches may be utilised. However, when the sampling current is relatively high, resistor-based sampling may suffer from relatively large power losses that can reduce the efficiency of the transformer, while the sampling volume of the Hall element (e.g., a magnetic device) can be relatively large and expensive. As a result, the overall cost of the power supply may be increased by this approach.

On the other hand, in order to realize accurate control of the output current of a switching regulator, the output current may be sampled for feedback control information, in order to maintain the output current as substantially constant by the current control loop. In some approaches, sampling of the output current can include a series connection of a relatively small resistor on the output current loop to obtain output current information by way of a voltage drop on the resistor.

Referring now to FIG. 1, shown is a schematic block diagram of an example current detection circuit in a switching regulator. In this example, sampling of the input current and output current can be performed by using an external resistor in a switching regulator. For example, resistor $R_{sin}$ can connect to input voltage $V_{in}$ of the switching regulator, and voltage drop $V_{sin}$ on resistor $R_{sin}$ can reflecting value of input current $I_{in}$ of the switching regulator. Similarly, resistor $R_{sout}$ can connect in series to output $V_{out}$ of the switching regulator, and voltage drop $V_{sout}$ on resistor $S_{out}$ can reflecting value of output current $I_{out}$ of the switching regulator.

In this manner, power losses may be generated on resistors $R_{sin}$ and $R_{sout}$, with a value that is in proportion to the values (resistances) of resistors $R_{sin}$ and $R_{sout}$, and the square number of the circuit input current, or the square number of the output current. In any event, the conversion efficiency of the switching regulator may be reduced with this approach due to such power losses. In order to reduce these losses, the values of resistors $R_{sin}$ and $R_{sout}$ may be as low as possible. However, with such low resistance values, low offset amplifiers A1 and A2 may be needed to amplify the voltage drop on respective resistors $R_{sin}$ and $R_{sout}$.

The use of such amplifiers may not only increase implementation costs of the overall circuit, but since each amplifier has a given DC static loss, circuit power losses can be further increased. For example, when the circuit input current is about 1 A, the value of input sampling resistor $R_{sin}$ can be about 100 mΩ, and the power loss of resistor $R_{sin}$ can be about 100 mW, which may not be suitable for high-efficiency applications. In addition, the current detection circuit shown in FIG. 1 may need a sampling resistor connected outside of the switching regulator, as well as an amplifier, thus possibly increasing circuit area and noise effects, while also potentially reducing system reliability.

In one embodiment, a current detection circuit configured to determine an input current and an output current of a switching regulator, can include: (i) a mirror circuit configured to mirror a current flowing through a main power transistor of the switching regulator to generate a sampling signal that is in proportion to the main power transistor current; (ii) a current generating circuit configured to perform a first average value calculation of the sampling signal based on a switching cycle of the switching regulator to determine the input current; and (iii) the current generating circuit being configured to perform a second average value calculation of the sampling signal based on a conduction duty cycle of the main power transistor to determine the output current.

Figure 2:
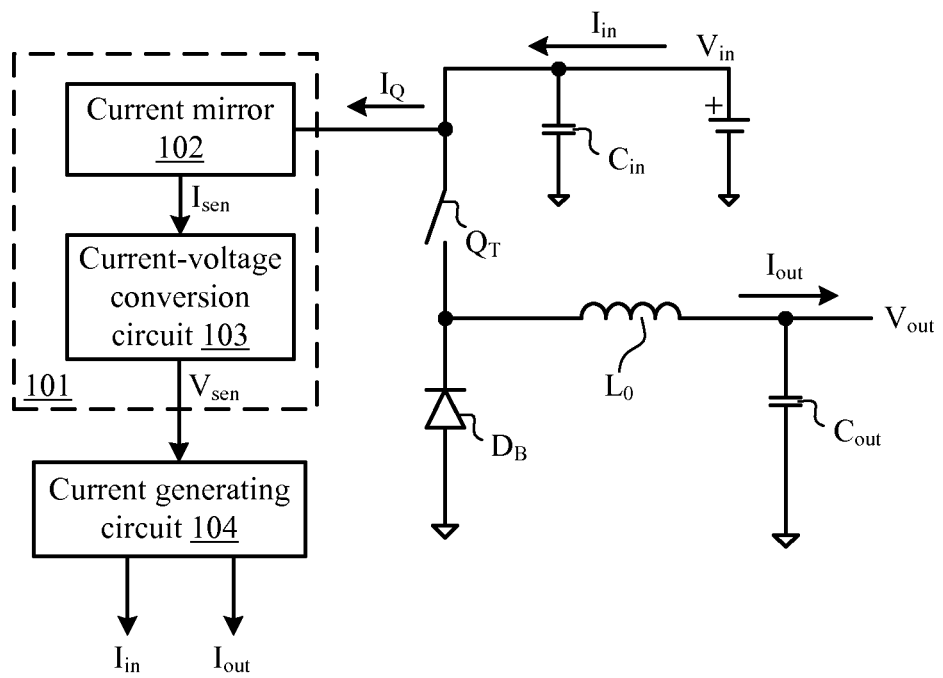
FIG. 2 is a schematic block diagram of a first example current detection circuit applied in a switching regulator, in accordance with embodiments of the present invention.

Referring now to FIG. 2, shown is a schematic block diagram of a first example current detection circuit applied in a switching regulator, in accordance with embodiments of the present invention. In this particular example, the switching regulator can be a buck converter topology; however, any suitable converter topology (e.g., boost, buck-boost, flyback, SEPIC, etc.) can be employed in certain embodiments. In this buck topology example, the duty cycle of main power switch (e.g., MOSFET transistor) $Q_T$ can be represented as D, and the relationship between output current $I_{out}$ and input current $I_{in}$ of the switching regulator can be as shown below in equation (1).

$$I_{in} = I_{out} \times D \tag{1}$$

In this particular example, information about the input current and the output current can be obtained indirectly by using switch current $I_Q$ flowing through main power switch $Q_T$. Here, the current detecting circuit can include mirror circuit 101 and current generating circuit 104. For example, mirror circuit 101 can include current mirror 102 and current-voltage conversion circuit 103. Current mirror 102 can be utilized for mirroring switch current $I_Q$ flowing through main power switch $Q_T$, in order to obtain sampling current $I_{sen}$ that is in proportion to switch current $I_Q$.

Current-voltage conversion circuit 103 can receive sampling current $I_{sen}$, and convert $I_{sen}$ into sampling voltage $V_{sen}$. Sampling voltage $V_{sen}$ can include information about, or be related to, the conduction duty cycle D of main power switch $Q_T$. Current generating circuit 104 can receive sampling voltage $V_{sen}$, and may perform an average value calculation on $V_{sen}$. For example, the average value calculation performed on sampling voltage $V_{sen}$ can be based on the switching cycle of the switching regulator, or conduction duty cycle D. In this way, input current $I_{in}$ and output current $I_{out}$ can be determined by current generating circuit 104.

In particular embodiments, a current detecting circuit can, according to a relationship between the input and output currents of the switching regulator, sample current information of a main power switch in a switching regulator, to indirectly obtain information about the input and output currents of the switching regulator. For example, there may be no need to include a series-connected sampling resistor in the input current circuit or the output current circuit in order to obtain such information about the input and output currents. Thus, power losses and implementation costs due to such a resistor can be reduced.

Figure 3A:
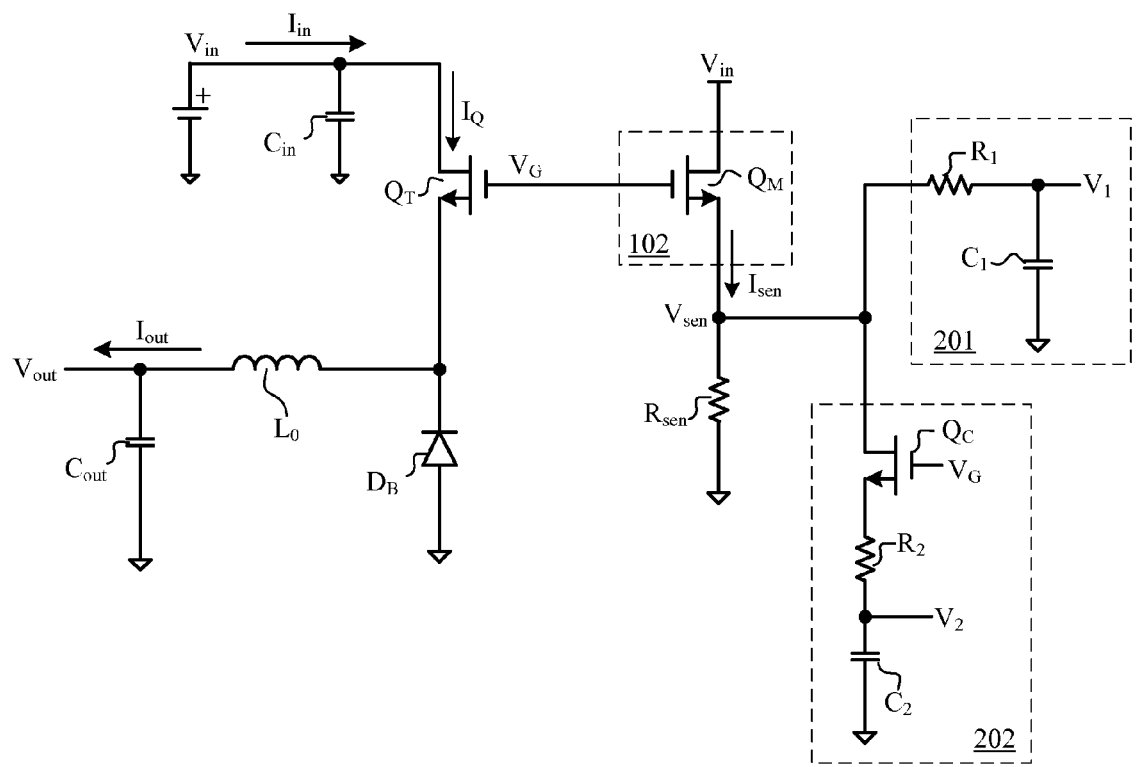
FIG. 3A is a schematic block diagram of a second example current detection circuit for a switching regulator, in accordance with embodiments of the present invention.

Referring now to FIG. 3A, shown is a schematic block diagram of a second example current detection circuit for a switching regulator, in accordance with embodiments of the present invention. For example, current mirror 102 can include mirror switch (e.g., transistor) $Q_M$ with a same type as main power switch $Q_T$. Here, MOSFET transistors (e.g., both NMOS transistors) can be used, and a ratio relationship of the current flowing through main power switch $Q_T$ and that flowing through mirror switch $Q_M$ is N:1 (e.g., based on the transistor widths or number of legs in the transistor layout). For example, the current of mirror switch $Q_M$ can be less than (e.g., from about 10% to about 90% of) the current flowing through main power switch $Q_T$. In order to further reduce power losses, N can, e.g., be greater than about 1000. Thus, detecting current $I_{sen}$ can be in proportion (e.g., directly proportional) to switch current $I_Q$ received by current mirror 102.

In this example, current-voltage conversion circuit 103 can include resistor $R_{sen}$ connected in series with current mirror 102, such that sampling voltage $V_{sen}$ generated across resistor $R_{sen}$ may be in proportion to switch or transistor current $I_Q$. Current generating circuit 104 can include filtering circuits 201 and 202. In this example, filtering circuit 201 can include an RC filter having resistor $R_1$ and capacitor $C_1$, and filtering circuit 202 can include serially transistor $Q_C$ and an RC filter having resistor $R_2$ and capacitor $C_2$. Also, the switch state (e.g., on or off) of transistor $Q_C$ and that of main power switch $Q_T$ may be consistent (e.g., both on or both off). For example, switch $Q_C$ may be a MOSFET transistor, or any other suitable type (e.g., BJT, LDMOS, etc.) of transistor. Also, filtering circuits 201 and 202 may be utilized to filter sampling voltage $V_{sen}$.

Figure 3B:
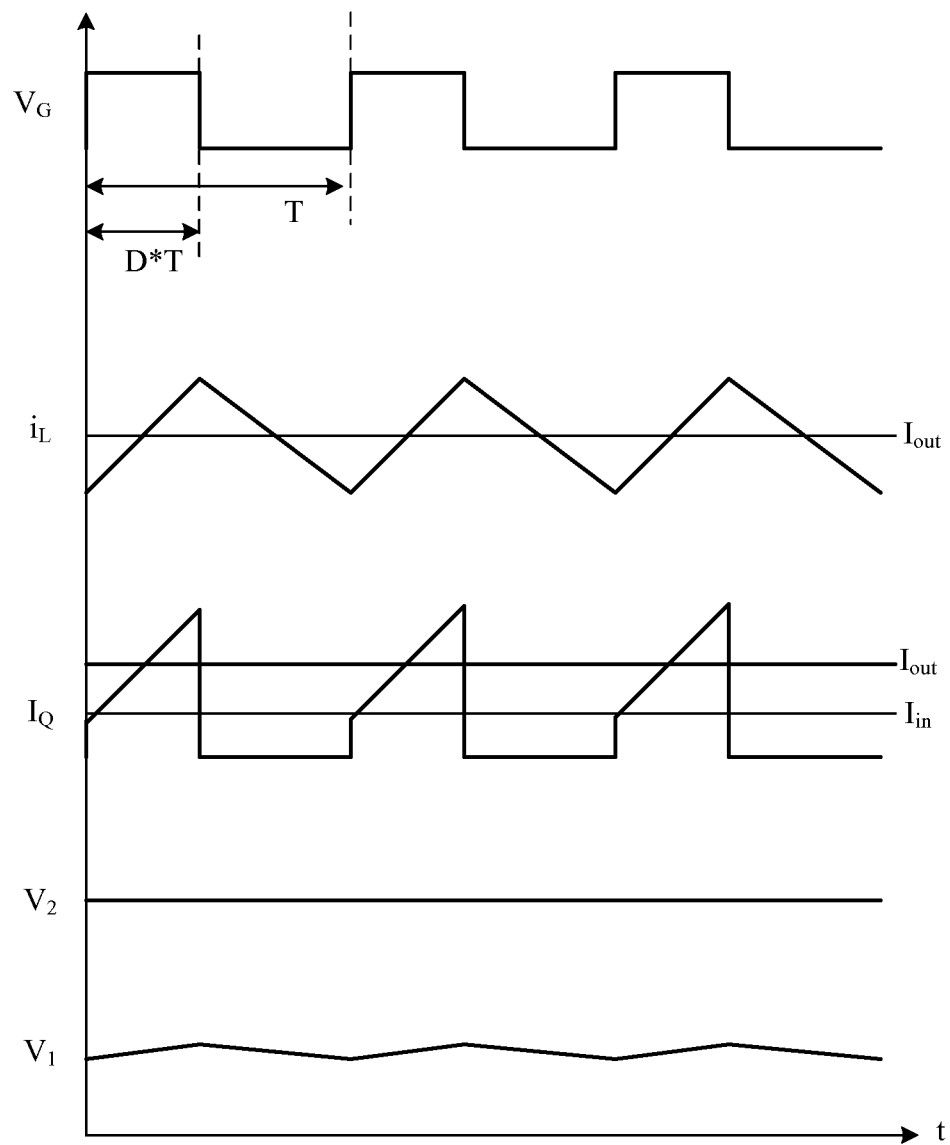
FIG. 3B is a waveform diagram showing example operation of the current detection circuit shown in FIG. 3A when the inductance current is continuous, in accordance with embodiments of the present invention.

Referring also to FIG. 3B, shown is a waveform diagram of example operation of the current detection circuit shown in FIG. 3A when the inductance current is continuous (e.g., continuous conduction mode [CCM]), in accordance with embodiments of the present invention. The switch state of main power transistor $Q_T$ may be as shown in waveform $V_G$, where $V_G$ can represent the gate voltage of main power transistor $Q_T$. For example, gate voltage $V_G$ can be generated by other control circuitry, such as a PWM controller. Within each switching cycle T, the conduction or "on" time of main power switch $Q_T$ can be represented as D×T.

The waveform of the inductance current flowing through inductor $L_0$ can be as shown in waveform $i_L$. For example, during the conduction time (e.g., D×T) of main power switch $Q_T$, inductance current $i_L$ may continuously rise to an inductance current peak. Also, during the off time of main power switch $Q_T$, inductance current $i_L$ may continuously fall from the inductance current peak. Since the inductance current may operate in CCM in this example, inductance current $i_L$ can be continuous (e.g., not zero for any significant time portion) during the entire switching cycle T.

The current flowing through main power switch $Q_T$ can be as shown in waveform $I_Q$. For example, during the conduction time of main power switch $Q_T$, switch current $I_Q$ may be consistent (e.g., a same or proportional value) with inductance current $i_L$. Also, during the off time of the main power switch $Q_T$, switch current $I_Q$ may remain at substantially zero. According to buck topology operation, output current $I_{out}$ may be the average value of inductance current $i_L$. Further, since inductance current $i_L$ is continuous in this particular example, the average value of inductance current $i_L$ may be the same as its average value when switch current $I_Q$ is in a conduction state. For example, the average value of switch current $I_Q$ during the conduction time (e.g., output current $I_{out}$) may be calculated by using filtering circuit 202.

Specifically, since the switch state of transistor $Q_C$ is consistent with the switch state of main power switch $Q_C$, and the time constant of the RC filter including resistor $R_2$ and capacitor $C_2$ can be set to be sufficiently large, output signal $V_2$ of filtering circuit 202 may be directly proportional to output current $I_{out}$, and the relationship between the two can be as shown below in equation (2).

$$V_2 = \frac{I_{out} \times R_{sen}}{N} \quad (2)$$

In addition, the average value of switch current $I_Q$ during the entire switching cycle T is input current $I_{in}$. According to buck topology operating principles, the relationship between input current $I_{in}$ and output current $I_{out}$ may be as shown below in equation (3).

$$I_{in} = I_{out} \times D \quad (3)$$

The relationship of output signal $V_1$ of filtering circuit 201, output signal $V_2$ of filtering circuit 202, and input current $I_{in}$, can be as shown below in equation (4).

$$V_1 = V_2 \times D = \frac{I_{out} \times R_{sen}}{N} \times D = \frac{I_{in} \times R_{sen}}{N} \quad (4)$$

Thus in particular embodiments, a current detecting circuit according to buck topology operating principles may determine that the relationship between the output current and the input current is related to the conduction duty cycle D of the main power switch (e.g., transistor $Q_T$). Therefore, the switch current (e.g., $I_Q$) of the main power switch can be sampled, and by performing an average value calculation on the switch current based on the entire switching cycle, and also based on the conduction time, information about (e.g., values of) the input current and the output current, respectively, can be determined.

Thus in this way, an average value calculation performed on the switch current and based on the entire switching cycle (e.g., averaged over the switching cycle) can be utilized to determine input current information for a buck topology regulator, and an average value calculation performed on the switch current and based on the conduction time (e.g., averaged over the main power switch on time) can be utilized to determine output current information for the buck topology regulator. In the particular example of FIG. 3A, a non-synchronous buck topology is shown, and thus this particular topology may utilize diode $D_B$. Particular embodiments are also suitable to synchronous buck topologies.

Figure 4A:
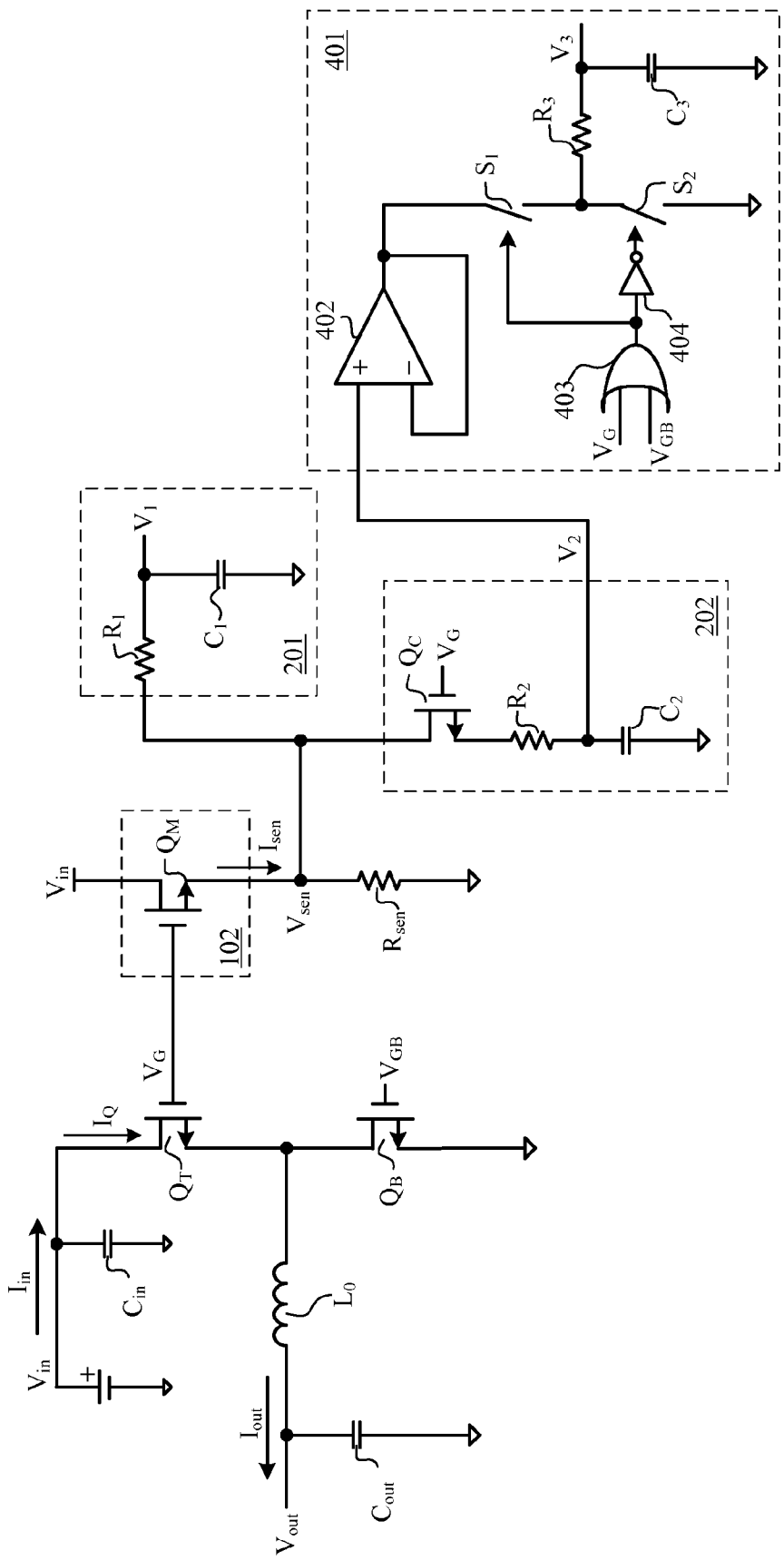
FIG. 4A is a schematic block diagram of a third example current detection circuit for a switching regulator, in accordance with embodiments of the present invention.

Referring now to FIG. 4A, shown is a schematic block diagram of a third example current detection circuit for a switching regulator, in accordance with embodiments of the present invention. In this particular example, the current detecting circuit may be applied in a discontinuous current mode (DCM). As compared to the example shown in FIG. 3A, additional filtering circuit 401 can be included, and the converter topology may be a synchronous buck topology. Here, synchronous switch $Q_B$ can connect in series with main power switch $Q_T$, and the switch state of synchronous switch $Q_B$ can be controlled by control signal $V_{GB}$.

Filtering circuit 401 can include amplifier 402, which can receive output signal $V_2$ from filtering circuit 202 to buffer output signal $V_2$. Controllable switches/transistors $S_1$ and $S_2$ can connect in series between an output of amplifier 402 and ground. The RC filter including resistor $R_3$ and capacitor $C_3$ can connect to a common node of controllable switches $S_1$ and $S_2$. For example, in each switching cycle, the conduction time of controllable switch $S_1$ can be a sum of the conduction times of main power switch $Q_T$ and synchronous switch $Q_B$, and controllable switch $S_1$ can be in a conduction state (on) for a remaining portion of the switching cycle.

FIG. 4A also shows one particular example circuit structure for realizing logic control of switches $S_1$ and $S_2$, including OR-gate 403 and inverter 404. Of course, other control logic and/or circuitry can be employed in particular embodiments. Here, OR-gate 403 can receive control signals $V_G$ and $V_{GB}$, and the output of OR-gate 403 can control a switch state of controllable switch $S_1$. In addition, the output of OR-gate 403 can be provided to inverter 404, and the output of inverter 404 can control switch state of controllable switch $S_2$.

Figure 4B:
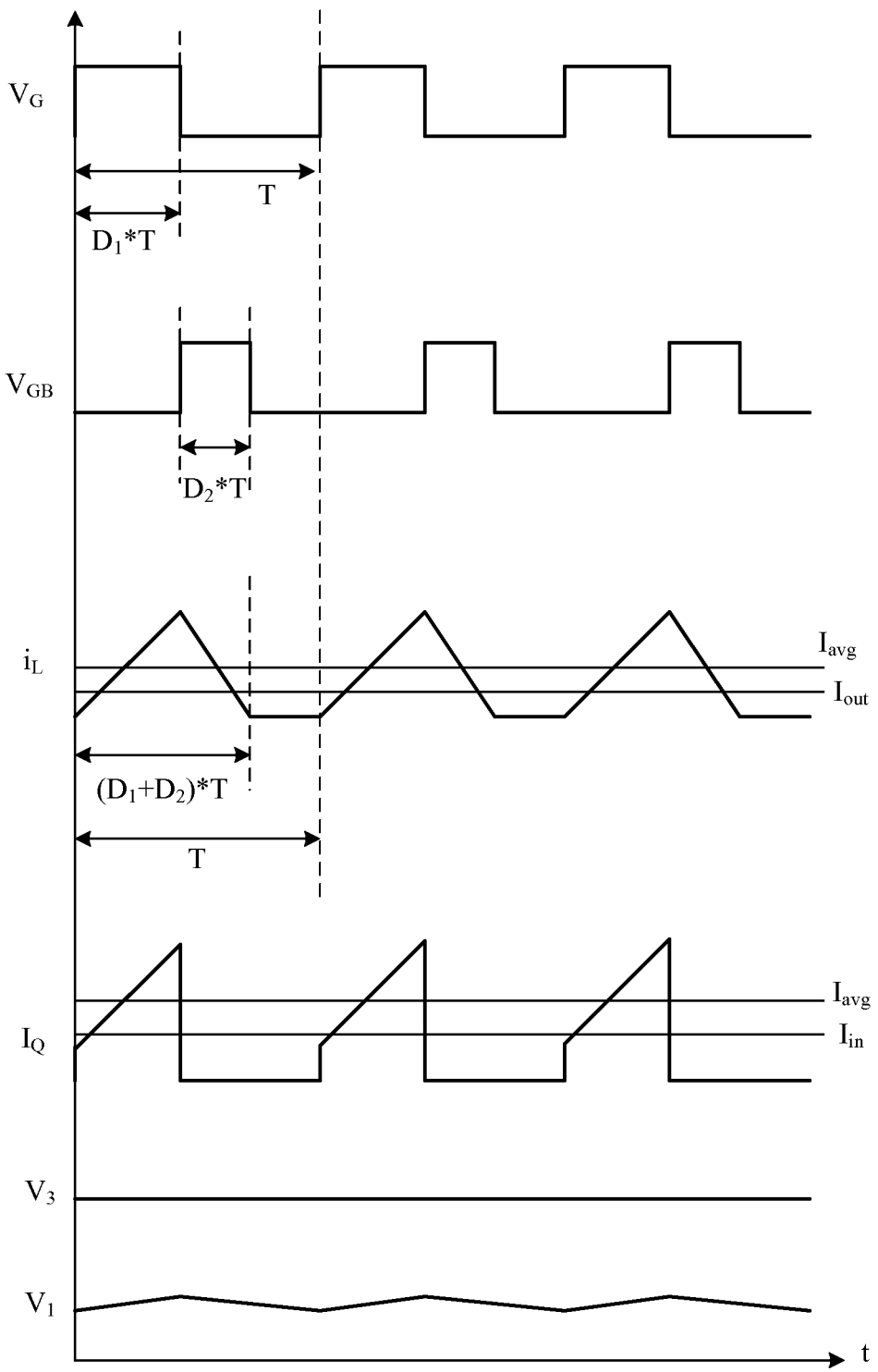
FIG. 4B is a waveform diagram showing example operation of the current detection circuit shown in FIG. 4A operating in DCM, in accordance with embodiments of the present invention.

Referring also to FIG. 4B, shown is a waveform diagram of example operation of the current detection circuit shown in FIG. 4A operating in DCM, in accordance with embodiments of the present invention. The switch state of main power switch $Q_B$ can be as shown in waveform graph $V_G$, and within each switching cycle T, the conduction time of main power switch $Q_T$ may be $D_1 \times T$. The switch state of synchronous switch $Q_B$ can be as shown in waveform $V_{GB}$, and in each switching cycle T, the conduction time of synchronous power switch $Q_T$ can be $D_2 \times T$.

The waveform of the inductance current flowing through inductor $L_0$ can be as shown in waveform graph $i_L$. For example, during the conduction time of main power switch $Q_T$, inductance current $i_L$ may continuously increase up to the inductance current peak. Also, during the conduction time of synchronous switch $Q_B$, inductance current $i_L$ may continuously fall from the inductance current peak to zero. In a remaining portion of the switching cycle, the inductance current $i_L$ can be zero.

According to buck topology operating principles, output current $I_{out}$ may be an average value of inductance current $i_L$. The current average value $I_{avg}$ of switch current $I_Q$. The conduction time may be the same as the average value in a time interval that the inductance current $i_L$ is not zero (e.g., the time interval of $(D_1+D_2) \times T$). By using filtering circuit 202, output signal $V_2$ in proportion to current average value $I_{avg}$ of switch current $I_Q$ within the conduction time can be determined. For example, an average value calculation may be performed on inductance current $i_L$ for the entire switching cycle by filtering circuit 401. Thus, output signal $V_3$ of filtering circuit 401 can be in direct proportion to output current $I_{out}$.

The current detecting circuit shown in FIG. 4A may also be suitable for inductance current operating in a continuous mode (e.g., CCM, boundary conduction mode [BCM]). In this case, controllable switch $S_1$ may remain on, and controllable switch $S_2$ may remain off. Therefore, while the circuits of FIGS. 3A and 4A may be applicable to different inductance current modes, when the inductance current operates in a continuous mode, the example shown in FIG. 3A may be particularly suitable, while when in the inductance current operates in a discontinuous mode, the example shown in FIG. 4A may be particularly suitable.

Figure 5A:
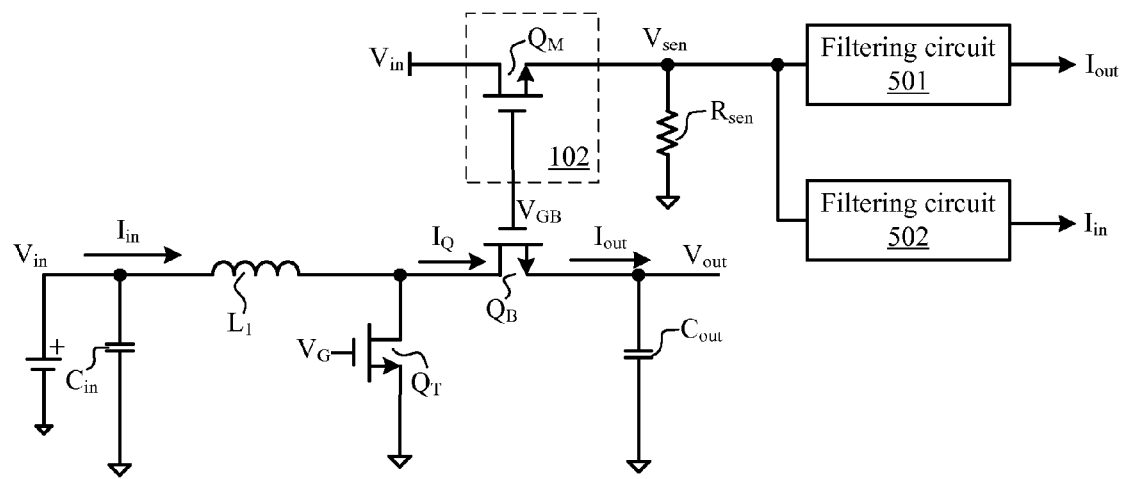
FIG. 5A is a schematic block diagram of a fourth example current detecting circuit for a switching regulator, in accordance with embodiments of the present invention.

Referring now to FIG. 5A, shown is a schematic block diagram of a fourth example current detecting circuit for a switching regulator, in accordance with embodiments of the present invention. In this example, a synchronous boost converter topology may be employed. According to boost topology operating principles, the ratio between the input and output currents may be consistent with the conduction duty cycle. Thus, switch current $I_Q$ flowing through synchronous switch $Q_B$ can be sampled by using current mirror 102 and sampling resistor $R_{sen}$, in order to generate sampling voltage $V_{sen}$.

Figure 5B:
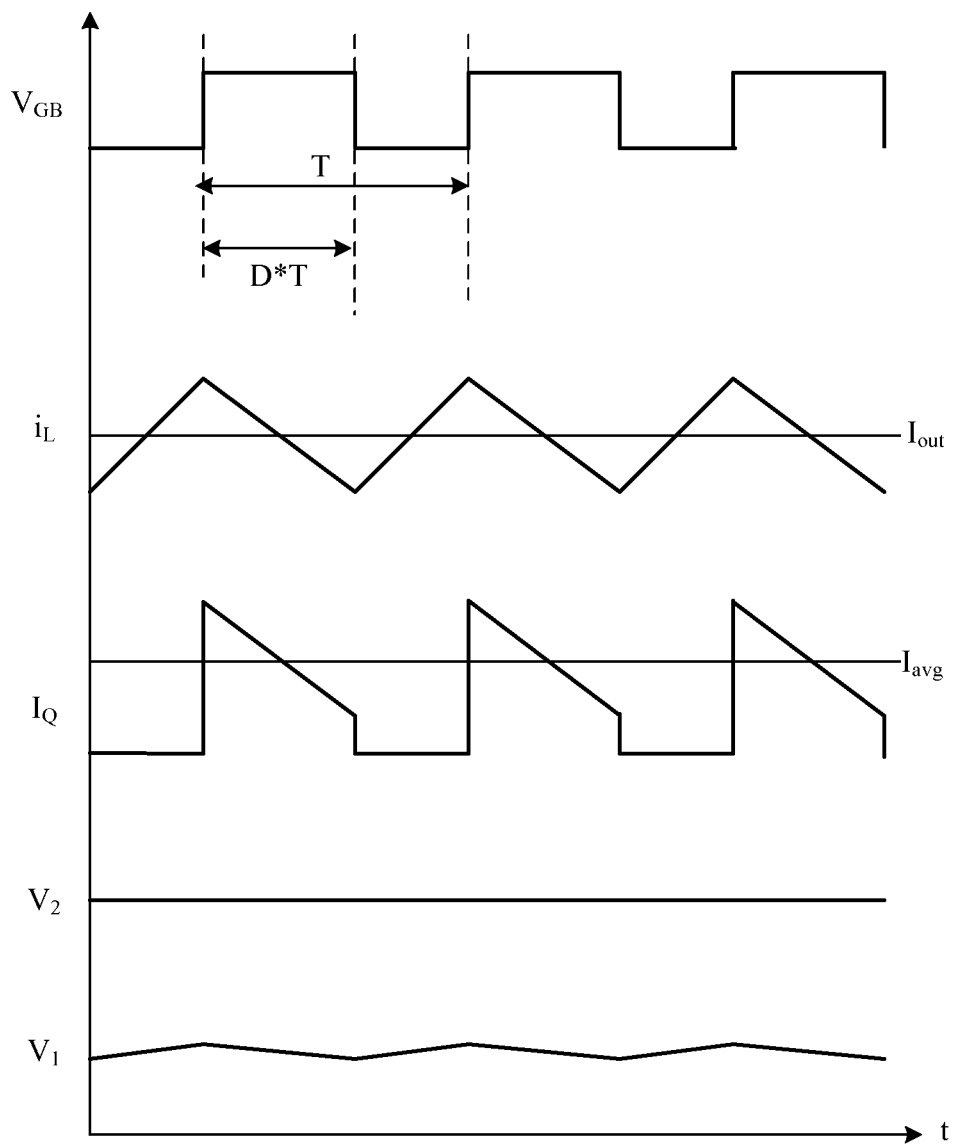
FIG. 5B is a waveform diagram showing example operation of the current detection circuit shown in FIG. 5A operating in a continuous current mode, in accordance with embodiments of the present invention.

Referring also to FIG. 5B, shown is a waveform diagram showing example operation of the current detection circuit of FIG. 5A operating in a CCM, in accordance with embodiments of the present invention. For example, during the conduction time of synchronous power switch $Q_B$, switch current $I_Q$ can be consistent with inductance current $i_L$. When the inductance current $i_L$ is continuous, during the conduction time of synchronous power switch $Q_B$, average value $I_{avg}$ of switch current $i_L$ can be consistent with the average value of inductance current $i_L$.

Because the average value of inductance current $i_L$ is consistent with input current $I_{out}$, an average value calculation can be performed on switch current $I_Q$ by filtering circuit 502 based on conduction duty cycle D. Thus, the output of filtering circuit 502 may be directly proportional to input current $I_{in}$. Also, switch current $I_Q$ may be equal to output current $I_{out}$ based on the average value of the switching cycle. Therefore, an average value calculation may be performed on switch current $I_Q$ by filtering circuit 501. Thus, the output of filtering circuit 501 may be directly proportional to output current $I_{out}$. In another example, when the inductance current is not continuous (similar to the example shown in FIG. 4A), another filtering circuit coupled to filtering circuit 502 can be included to improve the accuracy of determined input current $I_{in}$.

Figure 6:
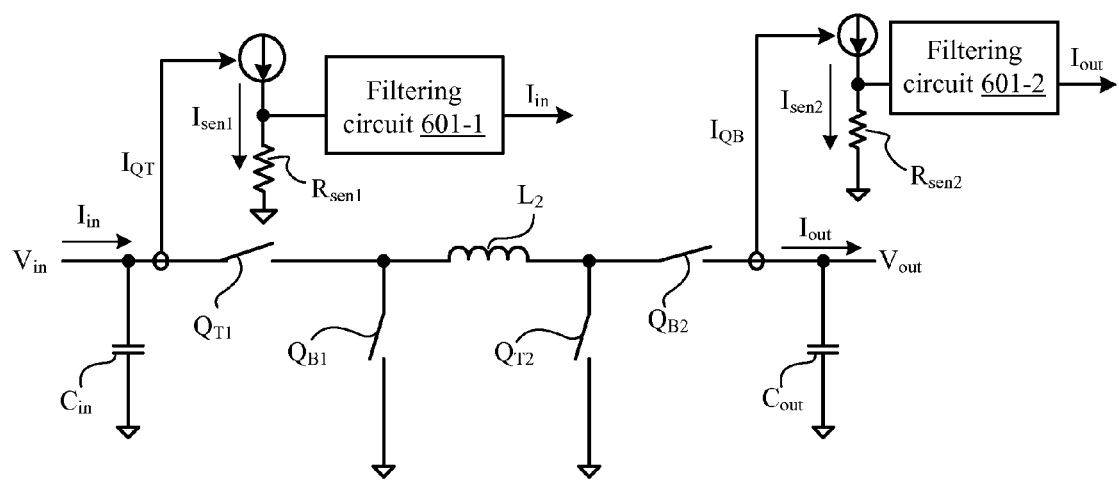
FIG. 6 is a schematic block diagram of a fifth example current detection circuit for a switching regulator, in accordance with embodiments of the present invention.

Referring now to FIG. 6, shown is a schematic block diagram of a fifth example current detection circuit for a switching regulator, in accordance with embodiments of the present invention. In this example, a four-switch buck-boost converter topology can be employed. Here, when switches $Q_{T1}$ and $Q_{T2}$ are turned on, the inductance current flowing through inductor $L_2$ may continuously rise, switch current $I_{QT}$ flowing through switch $Q_{T1}$ may be consistent with the inductance current, and inductor $L_2$ can store energy. Sampling switch current $I_{QT}$ can be performed in order to obtain detecting current $I_{sen1}$ in proportion thereto. Detecting current $I_{sen1}$ can also be converted into a voltage signal by resistor $R_{sen1}$. Further, an average value calculation can be performed by filtering circuit 601-1, in order to obtain an output signal that is in proportion to input current $I_{in}$.

When switches $Q_{B1}$ and $Q_{B2}$ are turned on, the inductance current flowing through inductor $L_2$ may continuously fall, switch current $I_{QB}$ flowing through switch $Q_{B1}$ can be consistent with the inductance current, and inductor $L_2$ may release energy. Sampling switch current $I_{QB}$ can be performed to obtain detecting current $I_{sen2}$ in proportion thereto. Detecting current $I_{sen2}$ can be converted into a voltage signal by resistor $R_{sen2}$. Also, an average value calculation can be performed by filtering circuit 601-2, in order to obtain an output signal that is in proportion to output current $I_{out}$.

Figure 7:
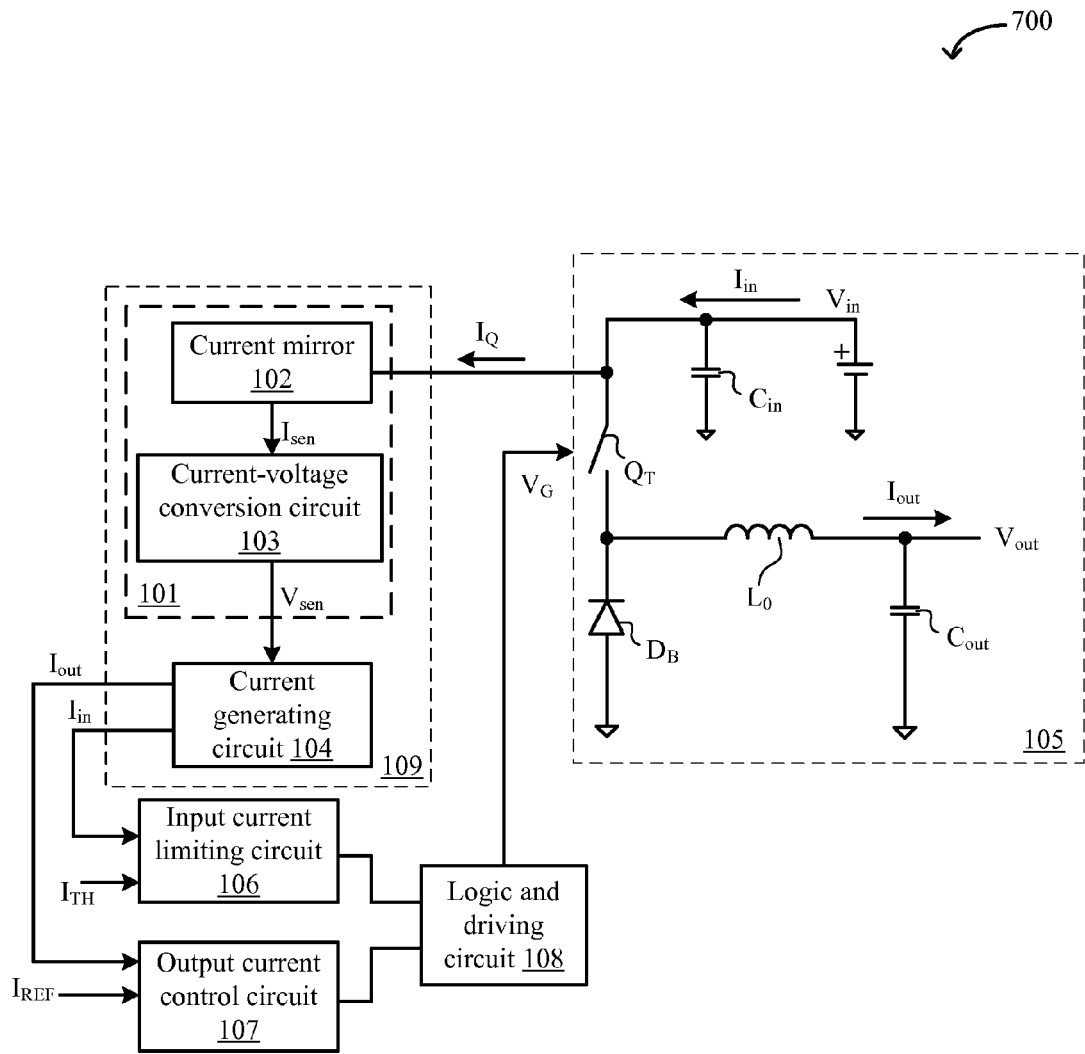
FIG. 7 is a schematic block diagram of an example switching regulator in accordance with embodiments of the present invention.

Referring now to FIG. 7, shown is a schematic block diagram of an example switching regulator in accordance with embodiments of the present invention. In this example, switching regulator 700 can include power stage circuit 105, current detecting circuit 109, input current limiting circuit 106, and output current control circuit 107. Power stage circuit 105, while here shown as a buck converter topology, can be any suitable converter topology (e.g., buck, boost, flyback, etc.). In addition, current detecting circuit 109 may be any current detecting circuit according to the examples above (see, e.g., FIGS. 2, 3A, 4A, 5A, 6A).

Input current limiting circuit 106 may receive input current information $I_{in}$ from current detecting circuit 109, and also predetermined threshold $I_{TH}$. Output current control circuit 107 may receive output current information $I_{out}$ from current detecting circuit 109, as well as expected output current $I_{REF}$. Input current limiting circuit 106 and output current control circuit 107 may generate corresponding control signals for logic and driving circuit 108.

By logic and driving circuit 108, when input current $I_{in}$ is greater than predetermined threshold $I_{TH}$, main power switch $Q_T$ in power stage circuit 105 may be turned off in order to limit input current $I_{in}$. Moreover, corresponding driving signal $V_G$ can be generated by logic and driving circuit 108 to control a switch state of main power switch $Q_T$ in power stage circuit 105. This structure can be used to maintain the output current of power stage circuit 105 to be substantially consistent with that of expected output current $I_{REF}$.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A current detection circuit configured to determine an input current and an output current of a switching regulator, the current detection circuit comprising:
   a) a mirror circuit configured to mirror a current flowing through a main power transistor of said switching regulator to generate a sampling signal that is in proportion to said main power transistor current;
   b) a current generating circuit configured to perform a first average value calculation of said sampling signal based on a switching cycle of said switching regulator to determine said input current; and
   c) said current generating circuit being configured to perform a second average value calculation of said sampling signal based on a conduction duty cycle of said main power transistor to determine said output current.

2. The current detection circuit of claim 1, wherein said mirror circuit comprises:
   a) a current mirror configured to generate a sampling current that is in proportion to said main power transistor current; and
   b) a current-voltage conversion circuit configured to convert said sampling current into said sampling signal, wherein said sampling signal comprises a sampling voltage.

3. The current detection circuit of claim 1, wherein said current generating circuit comprises:
   a) a first filtering circuit comprising a first RC filter having a first resistor and a first capacitor; and
   b) a second filtering circuit comprising a first transistor coupled in series with a second RC filter having a second resistor and a second capacitor, wherein a switch state of said first transistor is consistent with a switch state of said main power transistor.

4. The current detection circuit of claim 3, wherein said current detection circuit further comprises a third filtering circuit configured to perform said first and second average value calculations on an output of said second filtering circuit based on a duration of inductance current in said switching regulator and said switching cycle of said switching regulator.

5. The current detection circuit of claim 4, wherein:
   a) said switching regulator comprises a buck converter topology;
   b) said first filtering circuit is configured to filter said sampling signal to obtain said input current;
   c) an output of said third filtering circuit is configured as said output current when said inductance current is in a discontinuous current mode (DCM); and
   d) said second filtering circuit is configured to filter said sampling signal based on said conduction duty cycle to determine said output current when said inductance current is not in said DCM.

6. The current detection circuit of claim 5, wherein said buck converter topology comprises a non-synchronous buck topology.

7. The current detection circuit of claim 5, wherein said buck converter topology comprises a synchronous buck topology.

8. The current detection circuit of claim 4, wherein:
   a) said switching regulator comprises a synchronous converter topology;
   b) said first filtering circuit is configured to filter said sampling signal to generate said output current;
   c) an output of said third filtering circuit is configured as said input current when said inductance current is in said DCM; and
   d) said second filtering circuit is configured to filter said sampling signal based on said conduction duty cycle to generate said input current when said inductance current is not in said DCM.

9. The current detection circuit of claim 4, wherein said third filtering circuit comprises:
   a) a second transistor and a third transistor coupled in series between an output of said second filter circuit and ground; and
   b) a third RC filter coupled to a common node of said second and third transistors, wherein within each switching cycle, said second transistor is on for a duration of said inductance current, and said third transistor is on for a remaining time interval of said switching cycle.

10. The current detection circuit of claim 9, wherein said third filtering circuit comprises a buffer coupled to an output of said second filtering circuit.

11. The current detection circuit of claim 1, wherein:
   a) said switching regulator comprises a four-switch buck-boost topology;
   b) said mirror circuit is configured to sample said main power transistor current in a buck structure of said switching regulator to generate a first sampling signal, and to sample said main power transistor current in a boost structure of said switching regulator to generate a second sampling signal;
   c) said current generating circuit comprises second and third RC filters, said second RC filter being configured to filter said first sampling signal to generate said input current, and said third RC filter being configured to filter said second sampling signal to generate said output current.

12. A switching regulator, comprising the current detection circuit of claim 1, and further comprising:
   a) an input current restricting circuit configured to restrict said input current from said current detection circuit when said input current is greater than a predetermined threshold;
   b) an output current control circuit configured to generate a control signal based on said output current from said current detection circuit and an expected output current; and
   c) a power stage circuit, wherein said control signal is configured to maintain an output current of said power stage circuit and said expected output current as substantially consistent.

* * * * *